(12) United States Patent
Szwec et al.

(10) Patent No.: US 6,760,675 B1
(45) Date of Patent: Jul. 6, 2004

(54) ADJUSTABLE HIGH CURRENT AND HIGH VOLTAGE PULSE GENERATOR

(75) Inventors: Richard J. Szwec, Roanoke, VA (US); David R. Kegley, Roanoke, VA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 298 days.

(21) Appl. No.: 09/907,905

(22) Filed: Jul. 19, 2001

(51) Int. Cl.$^7$ .......................... G06F 19/00; G06F 1/04; H03K 3/00
(52) U.S. Cl. .................... 702/78; 327/178; 327/291
(58) Field of Search ................................ 327/164, 165, 327/166, 167, 172, 178, 291; 702/78, 79

(56) References Cited

U.S. PATENT DOCUMENTS

| | | | |
|---|---|---|---|
| 3,855,617 A | | 12/1974 | Jankowski et al. |
| 4,222,108 A | * | 9/1980 | Braaten .......................... 708/9 |
| 4,316,259 A | | 2/1982 | Albrecht et al. |
| 4,667,302 A | * | 5/1987 | Mackey et al. .............. 708/272 |
| 4,791,384 A | | 12/1988 | Mackey et al. |
| 5,029,120 A | | 7/1991 | Brodeur et al. |
| 5,430,660 A | * | 7/1995 | Lueker et al. ............... 702/124 |
| 5,463,334 A | * | 10/1995 | Griffin et al. ................ 327/106 |
| 5,559,458 A | | 9/1996 | Holler, Jr. |
| 5,677,647 A | * | 10/1997 | Knierim ...................... 330/263 |
| 5,774,704 A | | 6/1998 | Williams |
| 6,029,090 A | * | 2/2000 | Herbst .......................... 607/66 |
| 6,072,408 A | | 6/2000 | Baer et al. |
| 6,397,173 B1 | * | 5/2002 | Campbell et al. ............. 703/20 |
| 6,463,390 B1 | * | 10/2002 | Miyamori et al. ............. 702/68 |
| 2002/0140464 A1 | * | 10/2002 | Yampolsky et al. ......... 327/100 |
| 2002/0143365 A1 | * | 10/2002 | Herbst ............................ 607/2 |

OTHER PUBLICATIONS

1998 HP Test & Measurement Catalog, "Function Generators & Waveform Synthesizers", p. 160.*
Copy of PCT Notification of Transmittal of the International Search Report or the Declaration of Application No. PCT/US02/22704.
Schild et al.: "Microcontrollers as Inexpensive Pulse Generators and Parallel Processors in Electrophysiological Experiments'Medical and Biological Engineering and Computing", Peter Peregrinuys Ltd. Stevenage, GB vol. 34, No. 4, Jul. 1, 1996, pp. 305–307, XP000595516 ISSN: 0140–0118.
Copy of Written Opinion dated Aug. 29, 2003 for Application Ser. No.: PCT/US02/22704.

* cited by examiner

Primary Examiner—Patrick Assouad
(74) Attorney, Agent, or Firm—RatnerPrestia

(57) ABSTRACT

A controllable pulse generator apparatus and method are provided according to the invention. The pulse generator generates an adjustable, high current, high voltage pulse train output that may be transmitted to an external device under operation. The pulse generator includes a controller device and a pulse generator device. The controller device accepts one or more pulse train requests, may accept one or more external signals, and may accept feedback from the device under operation. The controller device generates one or more pulse train signals in response to the pulse train requests, the external signals, and the feedback. The controller device transmits the one or more pulse train signals to the pulse generator device. The pulse generator device receives the one or more pulse train signals and in response generates a pulse train output of a predetermined current level and of a predetermined voltage level according to the one or more pulse train signals.

36 Claims, 4 Drawing Sheets

ADJUSTABLE HIGH CURRENT AND HIGH VOLTAGE PULSE GENERATOR

BACKGROUND OF THE INVENTION

1. Field of the Invention

The present invention relates generally to a pulse generator, and more particularly to an adjustable, high current, high voltage pulse generator.

2. Description of the Background Art

Pulse generators are electronic devices that create electronic pulse train signals, such as a square wave signal. A pulse train may be used for a variety of things, such as feedback and control of motors, electronic displays, etc. In addition, a pulse train may be used in communication applications or for testing of devices, such as semiconductor devices, wherein a load on the device may be varied by modifying the characteristics of a pulse train.

The pulse train may need to be provided with a variety of characteristics. Some of the characteristics that may need to be adjusted and controlled are the pulse rate/frequency, the pulse position, the pulse width, the pulse duty cycle, the voltage and current drive levels etc. Therefore, there is a large need for pulse generators that are controllable, flexible, and able to provide a high voltage and a high current output.

In the prior art, a pulse generator is typically a dedicated device, and may include an oscillator, amplifiers, and wave shaping circuitry. A pulse generator in the prior art generally provides a fixed voltage and current pulse train capability (such devices are relatively inexpensive and simple).

However, a pulse generator according to the prior art has several drawbacks. Because prior art pulse generators are usually designed for a specific purpose or application, they generally do not provide a flexible output timing, current, and/or voltage characteristics. The prior art devices that can provide a varying signal, such as a common lab-type pulse generator, have a limited accuracy and limited voltage and current drive capacities. For example, a prior art pulse generator typically must be amplified. Prior art pulse generators are therefore limited in the maximum amount of current they can supply under load during the switching or pulsing of the output supply. The prior art pulse generators are not able to adjust the regulated output voltage under pulse conditions.

There remains a need in the art, therefore, for a pulse generator having a high voltage output and high current output, but that can be accurately controlled and adjusted.

SUMMARY OF THE INVENTION

A controllable pulse generator is provided according to one embodiment of the invention. The pulse generator comprises a pulse generator device capable of generating to an external device under operation a pulse train output of a predetermined current level and of a predetermined voltage level according to one or more pulse train signals. The pulse generator further comprises a controller device communicating with the pulse generator device. The controller device is capable of accepting one or more pulse train requests and accepting one or more external signals and outputting the one or more pulse train signals in response. The controller device comprises a communication interface capable of communicating with one or more external devices and receiving the one or more pulse train requests. The controller device further comprises an oscillator that generates a precision reference waveform and a power supply that provides electrical power. The controller device further comprises a processor communicating with the communication interface. The processor executes a control routine, receives the precision reference waveform from the oscillator, receives the one or more pulse train requests from the communication interface, and generates one or more pulse train commands in response to the one or more pulse train requests. The controller device further comprises a trigger device capable of providing a trigger signal to the external device under operation. The controller device further comprises an output interface capable of relaying the one or more pulse train signals to the pulse generator device. The controller device further comprises a signal interface including at least one signal port for receiving one or more external signals. The controller device further comprises a signal processor that communicates with the processor and receiving the one or more pulse train commands. The signal processor also communicates with the signal interface and receives one or more external signals. The signal processor generates and transmits the one or more pulse train signals to the output interface. The output interface transmits the one or more pulse train signals to the pulse generator device.

A controllable pulse generator is provided according to one embodiment of the invention. The pulse generator comprises a controller device capable of accepting one or more pulse train requests and accepting one or more external signals and outputting one or more pulse train signals in response. The pulse generator further comprises a pulse generator device communicating with the controller device and receiving the one or more pulse train signals. The pulse generator device is capable of generating a pulse train output of a predetermined current level and of a predetermined voltage level according to the one or more pulse train signals. The pulse generator device comprises a first load resistor that is connected to a DC supply node and to a first load resistor node. The pulse generator device further comprises a second load resistor that is connected to a first pass-through node and to a second load resistor node. The pulse generator device further comprises a third load resistor that is connected to an output node and to a voltage divider node. The pulse generator device further comprises a fourth load resistor that is connected to the voltage divider node and to a ground node. The pulse generator device further comprises a first pass-through MOSFET that includes an input that is connected to the first load resistor node, an output connected to the first pass-through node, and a bias input that is connected to a hot swap node. The first pass-through MOSFET buffers a current supplied at the first load resistor node. The pulse generator device further comprises a second pass-through MOSFET that includes an input that is connected to a nine volt regulator input node, an output connected to a fourth pass-through node, and a bias input that is connected to a third pass-through node. The second pass-through MOSFET used as a voltage interlock buffers a current supplied at the nine volt regulator input node. The pulse generator device further comprises a third pass-through MOSFET that includes an input that is connected to the second load resistor node, an output connected to a second pass-through node, and a bias input that is connected to an adjustable voltage output node. The third pass-through MOSFET buffering a current supplied at the second load resistor node. The pulse generator device further comprises a first voltage doubler that includes inputs connected to the DC supply node and the ground node. The first voltage doubler increases an input DC voltage level. The pulse generator device further comprises a second voltage doubler that includes inputs connected to the nine volt regulator input node and the ground node and an output that is connected to an eighteen volt output node. The second voltage doubler increases an input DC voltage level. The pulse generator device further comprises a third voltage doubler that includes inputs connected to the adjustable positive voltage output node and the ground node and an output that is connected to the nine volt regulator input node. The third voltage doubler increases an input DC voltage level. The pulse generator device further comprises a hot swap controller that includes inputs that are connected to the DC supply node, to the first load resistor node, and to the ground node, and an output that is connected to the hot swap node. The hot swap controller senses a current in the first load resistor and provides a zero voltage output if no load exists across the first load resistor. The pulse generator device further comprises a transient voltage suppressor connected across the DC supply node and the ground node. The pulse generator device further comprises a first precision op amp that includes inputs that are connected to the first pass-through node and the second load resistor node and a reference voltage is received from a nine volt node. The first precision op amp receives voltages across a second load resistor and provides a current monitor output. The current monitor output provides a current measurement related to a current level in the second load resistor. The pulse generator device further comprises a MOSFET power switch that includes an input that is connected to the second pass-through node, an output that is connected to the output node, and a control input that is connected to a power switch input node. The MOSFET power switch is capable of being turned off and on in order to create a pulse train output. The pulse generator device further comprises a MOSFET switch driver that includes an input that is connected to an isolator output node, an output that is connected to the power switch input node, and a bias input that is connected to the third pass-through node. The MOSFET switch driver controls the MOSFET power switch in response to the one or more pulse train signals from the controller device. The pulse generator device further comprises a manual voltage adjustment device capable of generating a variable voltage level in response to a user input. The pulse generator device further comprises an adjustable positive voltage regulator that includes an input that is connected to the second load resistor node, an output that is connected to the adjustable voltage output node, and a control input that is connected to the adjustable voltage input node and to the manual (or programmed control) voltage adjustment device. The adjustable positive voltage regulator receives a doubled voltage supply and the variable voltage level from the manual voltage adjustment device and provides a manually adjusted voltage level to the MOSFET power switch. The pulse generator device further comprises a digital optical isolator that is connected to the fourth pass-through node, to the isolator output node, and to the pulse input port. The digital optical isolator receives a nine volt regulated DC input and a pulse train signal from a pulse input port and gates the nine volt regulated DC input according to the pulse train signal. The pulse generator device further comprises a voltage divider connected across the output node and the ground node of the pulse generator device. The voltage divider comprises a third load resistor connected to the output node and to a voltage divider node. The voltage divider further comprises a fourth load resistor connected to the voltage divider node and to the ground node. The pulse generator device further comprises a second precision op amp that is connected to the voltage divider node and the ground node. The second precision op amp receives an eighteen volt regulated input and a divided output voltage input from the voltage divider node and outputs a voltage measurement signal at a voltage monitor port. The voltage measurement signal is related to an output voltage of the pulse generator device at the output node.

A method for providing an adjustable, high voltage, high current pulse train output is provided according to yet another embodiment of the invention. The method comprises the steps of receiving in a controller device one or more pulse train requests from an external device and receiving one or more external signals. The method further comprises the step of generating in the controller device one or more pulse train signals in response to the one or more pulse train requests and the one or more external signals. The method further comprises the step of transmitting the one or more pulse train signals to a pulse generator. The method further comprises the step of generating in the pulse generator a high voltage, high current pulse train output corresponding to the one or more pulse train signals.

The above and other features and advantages of the present invention will be further understood from the following description of the preferred embodiments thereof, taken in conjunction with the accompanying drawings.

DETAILED DESCRIPTION OF THE PREFERRED EMBODIMENTS

Figure 1:
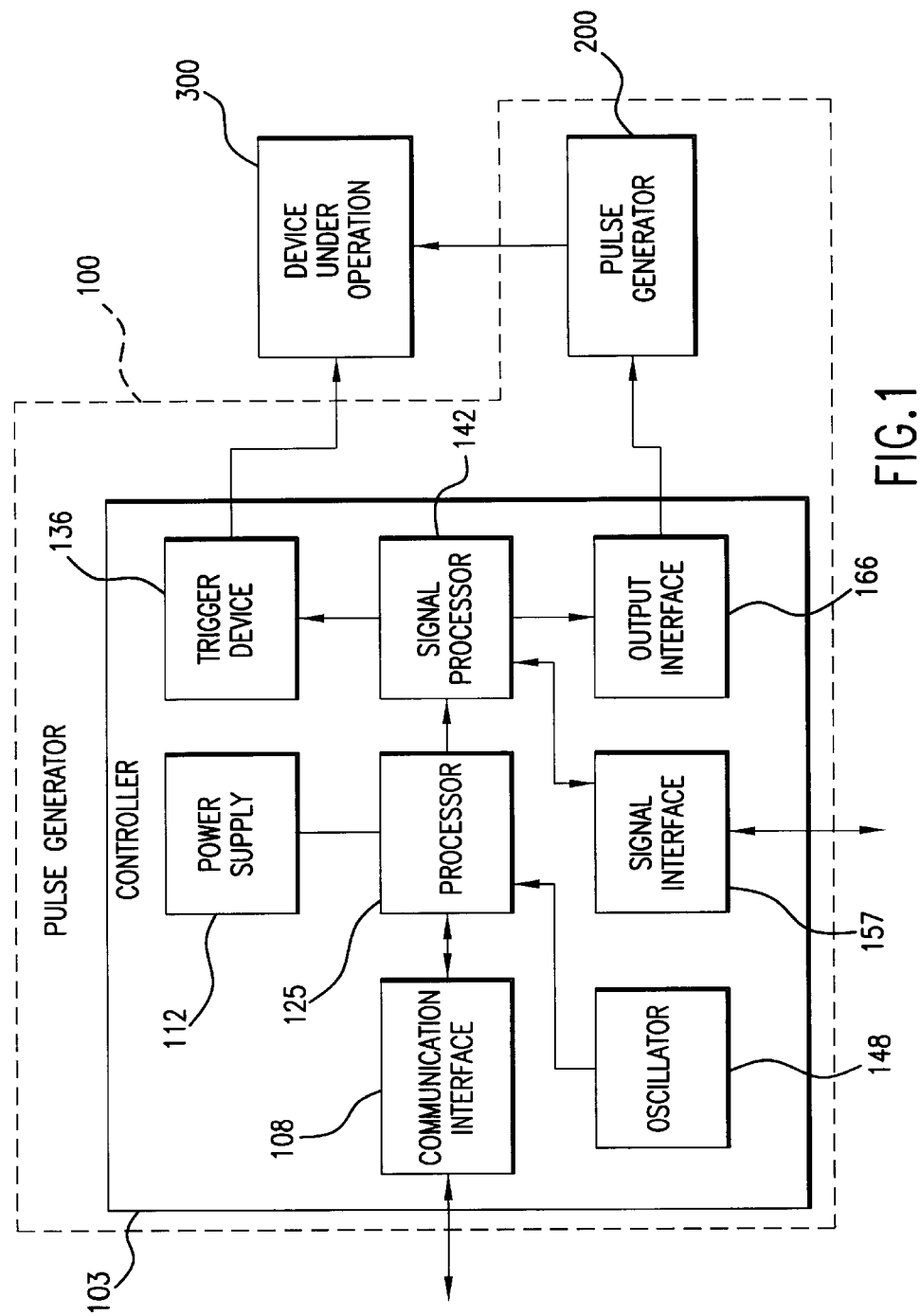
FIG. 1 is a block diagram of a pulse generator according to one embodiment of the invention.

FIG. 1 is a block diagram of a pulse generator 100 according to one embodiment of the invention. The pulse generator 100 may be connected to a device under operation 300 and may provide a triggering signal and a pulse train output to the device under operation 300.

The pulse generator 100 may comprise two main components: a controller device 103 and a pulse generator device 200. The controll er device 103 may set and control all characteristics of the pulse train output sent to the device under operation 300 by the pulse generator device 200. Therefore, the pulse generator device 200 receives one or more pulse train generating signals from the controller device 103 and generates a pulse train output according to the one or more pulse train generating signals.

In one embodiment, the controller device 103 includes a communication interface 108, a power supply 112, a processor 125, an oscillator 148, a signal interface 157, a trigger device 136, a signal processor 142, and an output interface 166.

The communication interface 108 may include one or more output ports and may include interface circuitry that allows the processor 125 to communicate with any manner and number of external devices. The communication interface 108 may include typical serial or parallel ports, industry recognized buses, analog ports, etc. In addition, the communication interface 108 may include other manner of communication interfaces such as, for example, an infrared or radio frequency wireless communication port, including a transmitter and receiver.

The processor 125 may be any type of general purpose processor and may execute a software control routine that implements the controller device 103. In addition, the processor 125 communicates with the communication interface 108 and may send and receive data, such as pulse train requests regarding the generation of a pulse train output.

The oscillator 148 may be any type of oscillator, and is preferably a precision oscillator such as a solid state oscillator. The oscillator 148 provides a precision clock signal to the processor 125. The precision clock signal may be used in order to control the timing of a generated pulse output signal.

The power supply 112 may be any type of power supply, including a DC power supply or an AC power supply. If the power supply 112 provides an AC voltage, the power supply 112 preferably also includes a DC converter or rectifier and may include smoothing or filtering circuits in order to provide a relatively noise free electrical power to the controller device 103. The power supply may provide electrical power to the processor 125, the communication interface 108, the oscillator 148, the signal interface 157, the trigger device 136, the signal processor 142, and the output interface 166.

The processor 125 may include a memory that may store a software routine that controls the overall operation of the controller device 103. In addition, the memory may include one or more pulse train command templates that allow the processor 125 to receive inputs, such as through the communication interface 108, and create one or more desired pulse train commands. The one or more pulse train commands enable the signal processor 142 to generate a pulse train output.

The signal processor 142 may be any type of processor that is capable of receiving one or more pulse train output commands from the processor and creating one or more pulse train signals therefrom. In addition, the signal processor 142 may receive signal inputs from the signal interface 157. The one or more pulse train signals preferably contain all desired pulse train characteristics, including voltage levels, current levels, duty cycle, frequency, pulse position, rise times, fall times, etc. The signal processor 142 may be any manner of programmable logic device (PLD), including a complex programmable logic device (CPLD), a digital signal processor (DSP), an application specific integrated circuit (ASIC), a field programmable gate array (FPGA), etc. The signal processor 142 may, therefore, include some manner of memory and may be programmed to create one or more pulse train signals in response to one or more pulse train commands from the processor 125.

The signal interface 157 may be an interface device that allows external signals to be input to the controller device 103. The signal interface 157, therefore, may receive a feedback signal from the device under operation 300, may receive analog or digital signal inputs, may receive an external pulse or pulse train, may receive a weal or insufficiently amplified pulse train, etc.

The trigger device 136 may be circuitry that receives a trigger command from the signal processor 142 and provides a trigger signal to the device under operation 300. The trigger may cause the device under operation 300 to change state or perform a predetermined operation. For example, if the device under operation is a transistor, it may be biased on or off by the trigger signal. If the device under operation 300 is a digital device, the trigger signal may provide on or off operational signal or signals that cause it to change states, for example.

The output interface 166 may be any sort of interface device that receives a pulse train signal from the signal processor 142 and may perform signal conditioning, wave shaping, amplification or some other sort of processing of the pulse train output before it is sent to the pulse generator device 200. In addition, the output interface 166 buffers the output.

Figure 2:
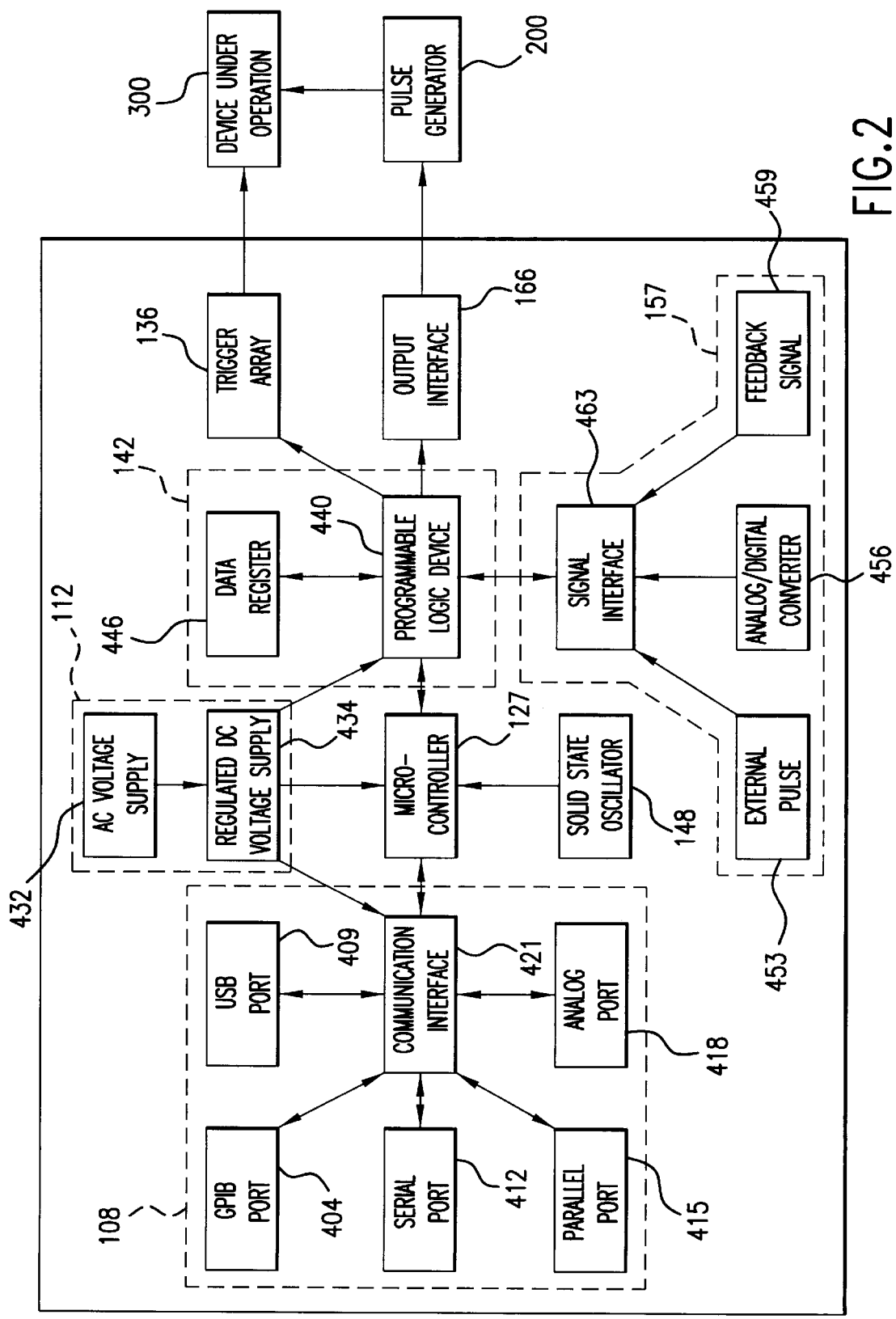
FIG. 2 is a block diagram of a controller device according to another embodiment of the invention.

FIG. 2 is a block diagram of a controller device 103 according to another embodiment of the invention. In this embodiment, several of the blocks from FIG. 1 are broken down into more detail. The communication interface 108 in this embodiment includes a general purpose instrumentation bus (GPIB) port 404, a universal serial bus (USB) port 409, a serial port 412, a parallel port 415, an analog port 418, and a communication interface 421. The communication interface 421 interfaces between the various ports and may provide any necessary translation or timing conversion in order to transmit and receive data via any of the above-mentioned ports.

In this embodiment, the processor 125 comprises a microcontroller 127. The microcontroller 127 may be any known or available microcontroller and may include onboard resources, such as random access memory (RAM), read-only memory (ROM), erasable programmable read-only memory (EPROM), etc. In addition, the microcontroller 127 may include input and output ports, onboard analog-to-digital converters, timers, reset watchdog circuitry, etc.

In this embodiment, the power supply 112 includes an AC voltage supply 432 and a regulated DC voltage supply 434. The AC voltage supply 432 may receive power from a standard 110 volt AC line. The regulated DC voltage supply 434 receives electrical power from the AC voltage supply 432 and may include a transformer or other form of rectifier and include filtering and smoothing circuitry to convert the AC to a regulated DC voltage.

In this embodiment, the signal processor 142 may include a programmable logic device 440 and at least one data register 446. The programmable logic device 440 may be programmed in the factory or may additionally be field programmable. Furthermore, the programmable logic device 440 may include a socket wherein the programmable logic device 440 may be removable. In this manner, the programmable logic device 440 may be substituted and may be updated, upgraded, or changed in any manner according to the need.

The data register 446 may include RAM or ROM memory and may comprise a working space wherein the programmable logic device 440 may perform arithmetic calculations, for example. In addition, the data register 446 may hold temporary values for future use, as needed.

The signal interface 157 in this embodiment includes an external pulse input port 453, an analog/digital converter port 456, and a feedback signal port 459, in addition to a signal interface device 463.

The external pulse input port 453 may accept an external pulse input that tells the controller device 103 to generate a pulse of certain characteristics. The external pulse input may be from, for example, another device.

The analog/digital converter input port 456 may allow an external device to input a signal in the form of a digital signal or digital information. The analog/digital converter input 456 may, therefore, include a digital-to-analog converter (DAC) that converts a digital signal to an analog signal for use in the signal processor 142.

The feedback signal port 459 may receive a feedback signal from the device under operation 300 in order to enable modification of the pulse train output that is sent to the device under operation 300.

The signal interface 463 may provide any necessary data, timing, voltage, or current conversions necessary to provide an interfacing between an external signal and the controller device 103. The signal interface 463 provides a converted external signal to processor 142. The signal interface 463 also could provide the converted external signal to the microcontroller 127.

The trigger array 136 may be an array of triggers or trigger values that may be selected and transmitted by the signal processor 142 in response to a pulse train request or in response to a received signal received by the signal interface 157. The output interface 166 provides the same function as previously described.

In operation, the controller device 103 may receive one or more pulse train requests and provides a pulse train command to the pulse generator device 200 which generates a desired and controllable pulse train output to the device under operation 300. This may comprise receiving one or more pulse train requests, generating one or more pulse train commands, receiving one or more external signals, and generating one or more pulse train signals in response. The one or more pulse train signals are transmitted by the controller device 103, to the pulse generator device 200, which generates a high voltage, high current pulse train output to the device under operation 300. The pulse train output corresponds to the one or more pulse train signals. In addition, the controller device 103 may output one or more trigger signals to the device under operation 300 in order to control the device under operation 300. Alternatively, the one or more trigger signals may be employed to control the use of the pulse train output provided by the pulse generator device 200.

Figure 3:
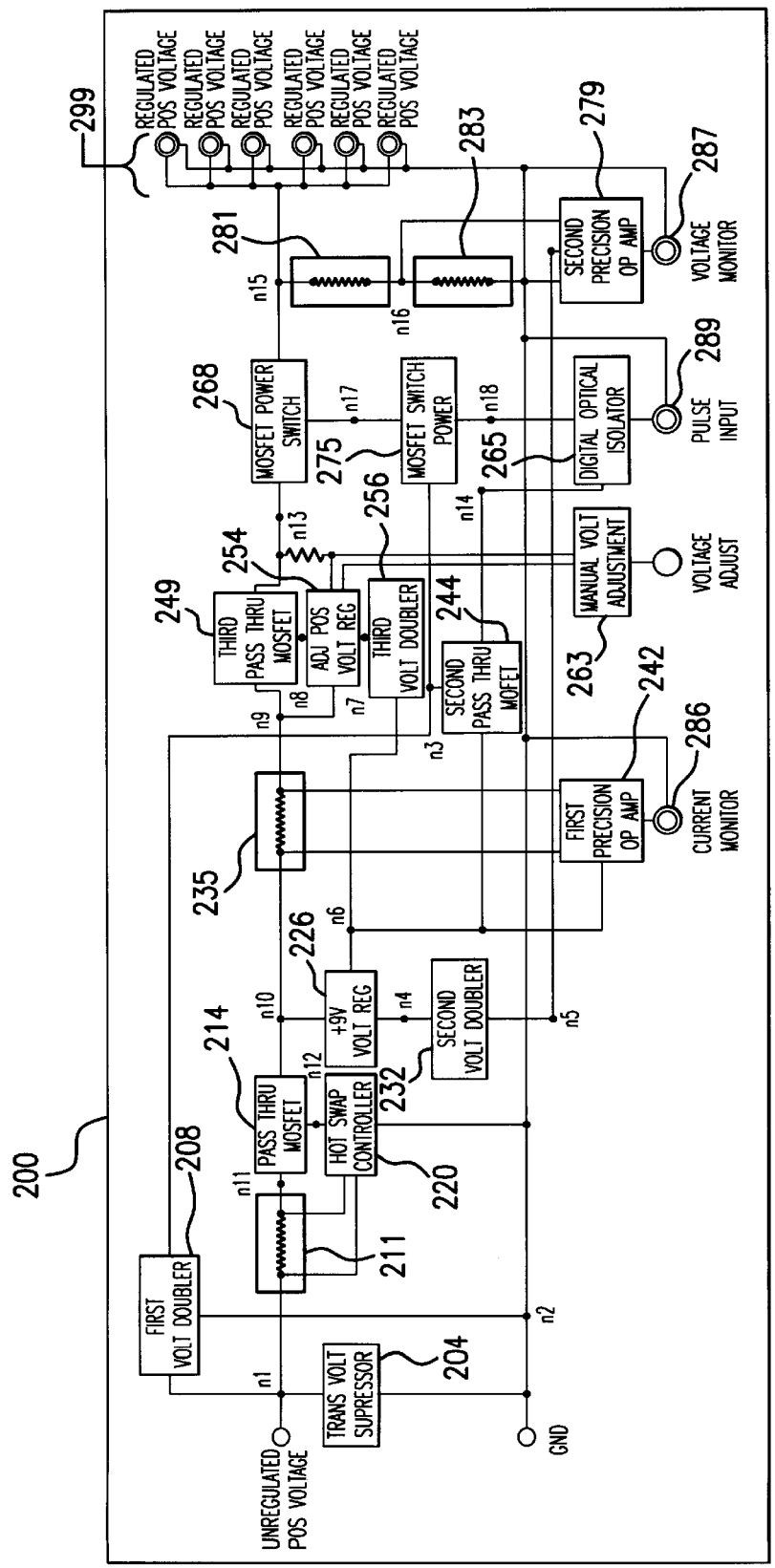
FIG. 3 shows detail of the pulse generator device according to one embodiment of the invention.

FIG. 3 shows detail of the pulse generator device 200 according to one embodiment of the invention. The pulse generator device 200 may include an unregulated, positive voltage input and a ground input (GND), and using the positive and ground voltage inputs may generate one or more pulse train outputs. At a DC supply node n1 and the ground node n2, the pulse generator device 200 receives the unregulated DC voltage from a power supply (not shown) having a sufficient voltage and current capacity to operate the device under control 300. The pulse a generator also receives in a pulse input port 289 one or more pulse train signals that are supplied from the controller device 103. The voltage level and current level of the pulse train output are therefore set by the controller device 103.

The pulse generator device 200 includes a transient voltage suppressor 204, a first voltage doubler 208, a first load resistor 211, a first pass-through MOSFET 214, a hot swap controller 220, a fixed nine volt voltage regulator 226, a second voltage doubler 232, a second load resistor 235, a first precision operational amplifier (op amp) 242, a second pass through MOSFET 249, an adjustable positive voltage regulator 254, a third voltage doubler 256, a third pass through MOSFET 244, a manual voltage adjustment device 263, a MOSFET power switch 268, a MOSFET switch driver 275, a digital optical isolator 265, a third load resistor 281, a fourth load resistor 283, and a second precision op amp 279. The voltage doublers can be implemented by using DC-DC converters. A DC-DC converter produces a greater current than a similar voltage doubler. Such a higher current results in faster switching of MOSFET power switch 268 by switch driver 275.

The outputs of the pulse generator device 200 include one or more pulse train output ports 299 connected to an output node n15, a current monitor output port 286, and a voltage monitor output port 287. The pulse generator device 200 further includes a pulse input port 289 that preferably receives the one or more pulse train signals from the controller device 103.

The transient voltage suppressor 204 is connected between a DC supply node n1 and a ground node n2. The transient voltage suppressor 204 may be any type of transient voltage suppressor, including an inductor coil, a filter network, etc.

The inputs of the first voltage doubler 208 are connected between the DC supply node n1 and the ground node n2. The output of the first voltage doubler 208 is connected to the third pass-through node n3. The output of voltage doubler 208 should exceed the supply voltage by a minimum of 4 volts to operate the N channel devices coupled to power MOSFET 268. The input of the second voltage doubler 232 is connected to the nine volt regulator input node n4. The output of the second voltage doubler 232 is connected to the eighteen volt output node n5. The input of the third voltage doubler 256 is connected to the node n7, which is the high reference voltage for the adjustable voltage regulator 254. The output of the third voltage doubler 256 is connected to the nine volt regulator input node n6. The first, second, and third voltage doublers 208, 232, and 256 may be any type of voltage doubler, including a DC-DC converter, for example.

The first load resistor 211 is connected to the DC supply node n1 and to the first load resistor node n11. The second load resistor 235 is connected to the first pass-through node n10 and the second load resistor node n9, which is a reference voltage for the adjustable voltage regulator 254. The third load resistor 281 is connected to the output node n15 and to the voltage divider node n16. The fourth load resistor 283 is connected to the voltage divider node n16 and to the ground node n2. The third and fourth load resistors 281 and 283 are therefore connected in parallel across the output node n15 and the ground node n2 and form a voltage divider network. The various load resistors 211, 235, 281 and 283 may be any type of high current capacity resistors that are capable of absorbing and dissipating excess electrical power, such as ceramic resistors, for example.

The first pass-through MOSFET 214 is connected to the first load resistor node n11 and the first pass-through node n10, and a bias input is connected to the hot swap node n12. The second pass-through MOSFET 244 is connected to the nine volt regulator input node n6 and the fourth pass-through node n14, and a bias input is connected to the third pass-through node n3. The third pass-through MOSFET 249 is connected to the second load resistor node n9 and the second pass-through node n13, and a bias input is connected to the adjustable voltage output node n8. The pass-through MOSFETs 214, 244, 249 may be any type of suitable MOSFET transistor that is capable of conducting electrical power at high current levels, and may be appropriately connected and biased P-channel or N-channel semiconductor devices.

The input of the nine volt positive voltage regulator 226 is connected to the first pass-through node n10, the output is connected to the nine volt node n6, and the control input is connected to the nine volt regulator input node n4. The input of the adjustable positive voltage regulator 254 is connected to the second load resistor node n9, the output is connected to the adjustable voltage output node n8 (which is a gate control for MOSFET 249), and the control input is connected to both the high voltage drive node n7 from voltage doubler 256, the manual voltage adjustment device 263, and the output of MOSFET 249. The nine volt positive voltage regulator 226 and the adjustable positive voltage regulator 254 may be any type of commercially available voltage regulator, such as a regulator that controls an output voltage based on an input voltage level. The input voltage level may be adjustable to allow changing of the output DC voltage level (i.e., the adjustable positive voltage regulator 254). The input voltage level may be received from the manual voltage adjustment device 263, which may be a potentiometer, variable transformer, programmable controller, etc. The manual voltage adjustment device 263 may be manually adjusted by an operator or by programmed operation.

The hot swap controller 220 is connected in parallel across the first load resistor 211. The inputs of the hot swap controller 220 are connected to the DC supply node n1, the first load resistor node n11, and the ground node n2, while the output is connected to the hot swap node n12. The hot swap controller 220 may be a voltage sensing regulator that cuts the power supply available through the pass through MOSFET 214 when an absence of load (or overload, i.e., short) is sensed across the first load resistor 211.

The inputs of the first precision op amp 242 are connected to the first pass-through node n10 and the second load resistor node n9. A reference voltage is received from the nine volt node n6. The first precision op amp 242 therefore is connected in parallel across the second load resistor 235. The first precision op amp 242 senses the current flowing through the second load resistor 235 and provides a current measurement to the current monitor output port 286.

The second precision op amp 279 is connected in parallel across the fourth load resistor 283, at the voltage divider node n16 and at the ground node n2. The second precision op amp 279 therefore receives the divided voltage level present between the third load resistor 281 and the fourth load resistor 283. The reference voltage is received from the eighteen volt node n5. The 18 volt reference voltage provides a 2 volt margin over the measured signal for op amp operation. The second precision op amp 279 senses the voltage present across the fourth load resistor 283 and provides a voltage measurement/voltage monitor output to the voltage monitor output port 287.

The input of the third pass-through MOSFET 249 is connected to the second load resistor node n9 and the output is connected to the second pass-through node n13. The bias input is connected to the adjustable voltage output node n8. The third pass-through MOSFET 249 may be controlled by the adjustable positive volt regulator 254, with the voltage available after the third pass-through MOSFET 249 being set by the adjustable positive volt regulator 254.

The input of the MOSFET power switch 268 is connected to the second pass-through node n13 and the output is connected to the output node n15. The bias input is connected to the power switch input node n17. The MOSFET power switch 268 must include a voltage capacity sufficient to exceed the supply voltage by a minimum of 5–10 volts to prevent damage from voltage transients on the filter capacitors (not shown). MOSFET switch 268 should have a current rating sufficient to drive the load. Multiple MOSFET power switches 268 may be connected in parallel to increase the current rating.

The input of the MOSFET switch driver 275 is connected to the isolator output node n18 and the output is connected to the power switch input node n17. The bias input is connected to the third pass-through node n3. The MOSFET power switch 268 is controlled by the MOSFET switch driver 275 in order to turn the DC power level off and on and generate a pulse train output, such as a square wave, for example.

The input of the digital optical isolator 265 is connected to the fourth pass-through node n14 and the output is connected to the isolator output node n18. The digital optical isolator 265 therefore is connected between the second pass-through MOSFET 244 and the MOSFET switch driver 275. MOSFET 244 serves as a voltage interlock to prevent pulsing of MOSFET driver 275 unless a voltage from voltage doubler 208 is present. The digital optical isolator 265 is also connected to the pulse input port 289, and an input pulse train signal received from the pulse input port 289 connects or interrupts the electrical power passing from the second pass-through MOSFET 244 to the MOSFET switch driver 275. In operation, the digital optical isolator 265 buffers the MOSFET switch driver 275 from the second pass-through MOSFET 244. The digital optical isolator 265 prevents crosstalk between the two components.

The output of the pulse generator device 200 may be provided to one or more output ports 299. The one or more output ports 299 receive an output voltage that exists across the third load resistor 281 and the fourth load resistor 283 as generated by the switching action of the MOSFET power switch 268. One or more of the output ports 299 may be connected to the device under operation 300, for example.

Figure 4:
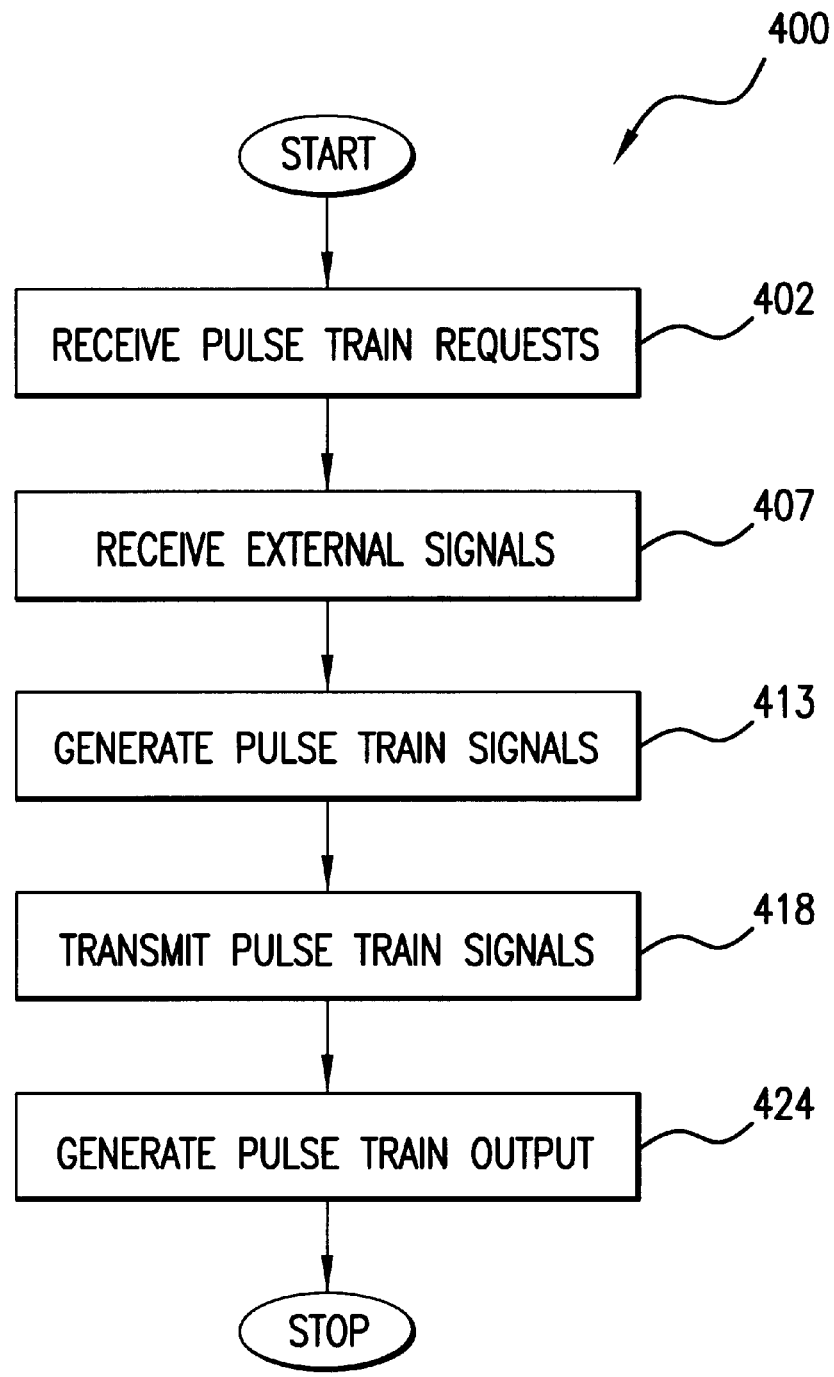
FIG. 4 is a flowchart of a method for providing an adjustable, high voltage, high current pulse train output according to another embodiment of the invention.

FIG. 4 is a flowchart 400 of a method for providing an adjustable, high voltage, high current pulse train output according to another embodiment of the invention. In step 402, one or more pulse train requests are received in a controller device from an external device. The external device may be any sort of device that generates a pulse train output request, such as a computer, test equipment, instrumentation, etc. The one or more pulse train requests may be received in any form, and may specify one or more pulse train characteristics, such as voltage, current, duty cycle, pulse position, pulse width, etc.

In step 407, one or more external signals may optionally be received in the controller device. The external signals may include an external pulse, an external feedback signal, or some manner of external analog or digital signal that needs conversion before it may be used. The external signal may trigger a response in the form of a predetermined pulse output characteristic. The external signal may be received in a signal interface. The signal interface may be capable of receiving one or more types of external signals and performing any needed translation.

In step 413, one or more pulse train signals are generated in response to the one or more pulse train requests and the one or more external signals. The one or more pulse train signals therefore specify a desired pulse train output, including all necessary pulse train characteristics for creating the desired pulse train output. This may additionally include referencing internally stored values, tables, formulas, etc., that may be employed in order to create one or more desired pulse train signals.

In step 418, the one or more pulse train signals thus created are transmitted from the controller device 103 to a pulse generator 200. The pulse generator 200 is responsible for creating a high voltage, high current pulse train output from the one or more pulse train signals.

In step 424, a pulse train output is generated in the pulse generator 200. The pulse train output may be a high voltage, high current pulse that corresponds to the one or more pulse train signals. The pulse generator 200 therefore achieves the desired voltage and current levels for the pulse train output.

The pulse train output may be provided to a device under operation 300. Therefore, the pulse train output may be used for applications such as feedback and control of devices, such as motors, displays, modulated communication signals, etc. In addition, a pulse train may be used for testing of devices, such as semiconductor devices wherein a load (duty cycle) on the device may be increased by increasing a pulse width.

In addition, the method may provide a trigger signal to the device under operation. The trigger signal may cause the device under operation 300 to change states or to change operating conditions in some manner. For example, if the device under operation 300 is a power transistor, the trigger signal may bias the transistor on and off in order to measure switching times, power consumption, heat dissipation, check for correct operation, etc.

The method may further include a step of receiving the feedback signal from the device under operation 300. The feedback signal may be employed in the step of generating the one or more pulse train signals that ultimately are used to create the pulse train output. Therefore, the feedback signal from the device under operation 300 may affect and control the final pulse train output. For example, the feedback signal may be related to a voltage or current level in the device under operation 300, and therefore the feedback signal may be used to ensure that a desired voltage or current level is achieved in the device under operation 300.

The method may further include a step of receiving an external pulse of some form and creating a pulse train signal that substantially reproduces the external pulse. The controller device 103 and the pulse controller device 200 may therefore receive a pulse train and recreate it at desired voltage and current levels.

While the invention has been described in detail above, the invention is not intended to be limited to the specific embodiments as described. It is evident that those skilled in the art may now make numerous uses and modifications of and departures from the specific embodiments described herein without departing from the inventive concepts.

What is claimed is:

1. A controllable pulse generator, comprising:
    a pulse generator device capable of generating to an external device under operation a pulse train output of a predetermined current level and of a predetermined voltage level according to one or more pulse train generating signals;
    a controller device directing signals to said pulse generator device, said controller device being capable of accepting one or more pulse train requests and outputting said one or more pulse train signals to said pulse generator in response to said one or more pulse train requests, said controller comprising:
        a communication interface capable of communicating with one or more external devices and receiving said one or more pulse train requests;
        an oscillator that generates a precision reference waveform;
        a processor communicating with said communication interface, said processor receiving said precision reference waveform from said oscillator, receiving said one or more pulse train requests from said communication interface, and generating one or more pulse train commands in response to said one or more pulse train requests; and
        a signal processor communicating with said processor and receiving said one or more pulse train commands, and generating and transmitting said one or more pulse train generating signals to said pulse generator device.

2. The pulse generator of claim 1, wherein said communication interface further comprises:
    an input port; and
    a communication interface device communicating with said input port and capable of translating a received pulse train request.

3. The pulse generator of claim 1, wherein said communication interface further comprises:
    a general purpose instrumentation bus (GPIB) port; and
    a communication interface device communicating with said GPIB port and capable of translating a received pulse train request.

4. The pulse generator of claim 1, wherein said communication interface further comprises:
    a universal serial bus (USB) port; and
    a communication interface device communicating with said USB port and capable of translating a received pulse train request.

5. The pulse generator of claim 1, wherein said communication interface further comprises:
    a serial port; and
    a communication interface device communicating with said serial port and capable of translating a received pulse train request.

6. The pulse generator of claim 1, wherein said communication interface further comprises:
    a parallel port; and
    a communication interface device communicating with said parallel port and capable of translating a received pulse train request.

7. The pulse generator of claim 1, further comprising a signal interface including:
    an external pulse port for receiving one or more external signals; and
    a signal device communicating with said external pulse port and capable of translating a pulse input signal.

8. The pulse generator of claim 1, further comprising a signal interface including:
    digital input signal port;
    a corresponding digital-to-analog converter communicating with said digital input signal port and creating an analog input signal; and
    a signal device communicating with said digital-to-analog converter and capable of translating said analog input signal.

9. The pulse generator of claim 1, further comprising a signal interface including:
    an analog input signal port;
    a corresponding analog-to-digital converter communicating with said analog input signal port and creating a digitized analog input signal; and
    a signal device communicating with said analog-to-digital converter and capable of translating said digitized analog input signal.

10. The pulse generator of claim 1, further comprising a signal interface including a feedback signal port and a signal device capable of translating an input signal.

11. The pulse generator of claim 1, wherein said signal processor comprises a programmable logic device (PLD) and a data register.

12. The pulse generator of claim 1, wherein said pulse generator device further comprises a MOSFET power switch that is capable of being turned off and on in order to create a pulse train output.

13. The pulse generator of claim 12, wherein said pulse generator device further comprises an adjustable positive voltage regulator that receives a doubled voltage supply and provides a manually adjustable voltage level to said MOSFET power switch.

14. The pulse generator of claim 12, wherein said pulse generator device further comprises and adjustable positive voltage regulator that receives a doubled voltage supply from a voltage adjustment device and provides a manually adjustable voltage level to said MOSFET power switch.

15. The pulse generator of claim 1, wherein said pulse generator device further comprises a MOSFET power switch that is capable of being turned off and on in order to create a pulse train output and a MOSFET switch driver that in response to said pulse train input from said controller device controls said MOSFET power switch.

16. The pulse generator of claim 1, wherein said pulse generator device further comprises a digital optical isolator that receives a low volt regulated DC input and gates said low volt regulated DC input according to a received pulse input.

17. The pulse generator of claim 1, wherein said pulse generator device further comprises:
   a digital optical isolator that receives a low volt regulated DC input and gates said low volt regulated DC input according to a received pulse input;
   a MOSFET switch driver that receives a gated low volt regulated DC voltage from said digital optical isolator and is turned off and on by said gated low volt regulated DC voltage in order to create a preliminary pulse train; and
   a MQSFET power switch that in response to said preliminary pulse train from said MOSFET switch driver is turned on and off to generate said pulse train output.

18. The pulse generator of claim 1, wherein said pulse generator device further comprises three or more voltage doublers that increase a DC voltage level in said pulse generator.

19. The pulse generator of claim 1, wherein said pulse generator device further comprises a hot swap controller connected in parallel with a first load resistor and with said first load resistor connected in series in a DC voltage supply.

20. The pulse generator of claim 1, wherein said pulse generator device further comprises a transient voltage suppressor connected in parallel across a DC voltage supply node and a ground node.

21. The pulse generator of claim 1, wherein said pulse generator device further comprises a first precision op amp that receives voltages across a second load resistor and provides a current monitor output, with said current monitor output providing a current measurement related to a current level in said second load resistor.

22. The pulse generator of claim 1, wherein said pulse generator device further comprises:
   a voltage divider connected in parallel across an output node of said pulse generator, with said voltage divider comprising a third load resistor connected to an output node and to a voltage division node, and with said voltage divider further comprising a fourth load resistor connected to said voltage division node and to a ground node;
   a second precision op amp that receives an inputs an eighteen volt regulated input and a divided output voltage from said voltage division node and outputs a voltage measurement signal at a voltage monitor port, wherein said voltage measurement signal is related to an output voltage at said output node of said pulse generator device.

23. A controllable pulse generator, comprising:
a controller device capable of accepting one or more pulse train requests and accepting one or more external signals and outputting one or more pulse train signals in response;
a pulse generator device communicating with said controller device and receiving said one or more pulse train signals, with said, pulse generator device being capable of generating to an external device under operation a pulse train output of a predetermined current level and of a predetermined voltage level according to said one or more pulse train signals, with said pulse generator device comprising:
   a first load resistor that is connected to a DC supply node and to a first load resistor node;
   a second load resistor that is connected to a first pass-through node and to a second load resistor node;
   a third load resistor that is connected to an output node and to a voltage divider node;
   a fourth load resistor that is connected to said voltage divider node and to a ground node;
   a first pass-through MOSFET that includes an input that is connected to said first load resistor node, an output connected to said first pass-through node, and a bias input that is connected to a hot swap node, said first pass-through MOSFET buffering a current supplied at said first load resistor node;
   a second pass-through MOSFET that includes an input that is connected to a low volt regulator input node, an input connected to a fourth pass-through node, and a bias input that is connected to a third pass-through node, said second pass-through MOSFET buffering a current supplied at said low volt regulator input node;
   a third pass-through MOSFET that includes an input that is connected to said second load resistor node, an output connected to a second pass-through node, and a bias input that is connected to an adjustable voltage output node, said third pass-through MOSFET buffering a current supplied at said second load resistor node;
   a first voltage doubler that includes inputs connected to said DC supply node and said ground node, said first voltage doubler increases an input DC voltage level;
   a second voltage doubler that includes inputs connected to said low volt regulator input node and said ground node and an output that is connected to an eighteen volt output node, said second voltage doubler increases an input DC voltage level;
   a third voltage doubler that includes inputs connected to said adjustable positive voltage node and said ground node and an output that is connected to said low volt regulator input node, said third voltage doubler increases an input DC voltage level;
   a hot swap controller that includes inputs that are connected to said DC supply node, to said first load resistor node, and to said ground node, and an output that is connected to said hot swap node, with said hot swap controller sensing a current in said first load resistor and providing a zero voltage output if a no load condition or overload condition exists across said first load resistor;
   a transient voltage suppressor connected across said DC supply node and said ground node;

a first precision op amp that includes inputs that are connected to said first pass-through node and said second load resistor node and a reference voltage is received from a low volt node, said first precision op amp receives voltages across a second load resistor and provides a current monitor output, with said current monitor output providing a current measurement related to a current level in said second load resistor;

a MOSFET power switch that includes an input that is connected to said pass-through node, an output that is connected to a said output node, and a control input that is connected to a power switch input node, said MOSFET power switch is capable of being turned off and on in order to create a pulse train output;

a MOSFET switch driver that includes an input that is connected to an isolator output node, an output that is connected to said power switch input node, and a bias input that is connected to said third pass-through node, said MOSFET switch driver controls said MOSFET power switch in response to said one or more pulse train signals from said controller device;

a voltage adjustment device capable of generating a variable voltage level in response to a user input;

an adjustable positive voltage regulator.that includes an input that is connected to said second load resistor node, an output that is connected to said adjustable voltage output node, and a control input that is connected to said adjustable voltage input node and to said voltage adjustment device, said adjustable positive voltage regulator receives a doubled voltage supply and said variable voltage level from said voltage adjustment device and provides a manually adjusted voltage level to said MOSFET power switch;

a digital optical isolator that is connected to said fourth pass-through node, to said isolator output node, and to said pulse input port, said digital optical isolator receives a low volt regulated DC input and a pulse train signal from a pulse input port and gates said low volt regulated DC input according to said pulse train signal;

a voltage divider connected across said output node and said ground node of said pulse generator device, with said voltage divider comprising a third load resistor connected to said output node and to a voltage divider node and a fourth load resistor connected to said voltage divider node and to said ground node; and a second precision op amp that is connected to said voltage divider node and said ground node and that receives as inputs an eighteen volt regulated input and a divided output voltage from said voltage divider node and outputs a voltage measurement signal at a voltage monitor port, wherein said voltage measurement signal is related to an output voltage of said pulse generator device at said output node.

24. The controllable pulse generator of claim 23, wherein said controller device further comprises a communication interface capable of communicating with one or more external devices.

25. The controllable pulse generator of claim 23, wherein said controller device further comprises an oscillator that generates a precision reference waveform.

26. The controllable pulse generator of claim 23, wherein said controller device further comprises a power supply that provides electrical power.

27. The controllable pulse generator of claim 23, wherein said controller device further comprises:

a communication interface capable of communicating with one or more external, devices and receiving said one or more pulse train requests;

a signal interface including at least one signal port for receiving one or more external signals; and a processor executing a control routine, communicating with said communication interface, receiving a precision reference waveform from an oscillator, receiving said one or more pulse train requests from said communication interface, and generating one or more pulse train commands in response to said one or more pulse train requests.

28. The controllable pulse generator of claim 23, wherein said controller device further comprises a trigger device capable of providing a trigger signal to said external device under operation.

29. The controllable pulse generator of claim 23, wherein said controller device further comprises an output interface capable of relaying said one or more pulse train signals to said pulse generator device.

30. The controllable pulse generator of claim 23, wherein said controller device further comprises a signal interface including at least one signal port for receiving one or more external signals.

31. The controllable pulse generator of claim 23, wherein said controller device further comprises:

a processor; and a signal processor communicating with said processor and receiving one or more pulse train commands from said processor, communicating with a signal interface and receiving one or more external signals, and generating and transmitting said one or more pulse train signals to an output interface, with said output interface transmitting said one or more pulse train signals to said pulse generator device.

32. A method for providing an adjustable, high voltage, high current pulse train output, comprising the steps of:

receiving in a controller device one or more pulse train requests from an external device;

receiving in said controller device one or more external signals; generating in said controller device one or more pulse train signals in response to said one or more pulse train requests and said one or more external signals;

transmitting said one or more pulse train signals to a pulse generator; and generating in said pulse generator a high voltage, high current pulse train output corresponding to said one or more pulse train signals.

33. The method of claim 32, further comprising the step of providing said pulse train output to a device under operation.

34. The method of claim 32, further comprising the step of providing a trigger signal to a device under operation.

35. The method of claim 32, further comprising the step of receiving a feedback signal from a device under operation and employing said feedback signal in the step of generating said one or more pulse train signals.

36. The method of claim 32, further comprising the step of receiving an external pulse and generating a pulse train signal that substantially reproduces said external pulse.

* * * * *